(12) United States Patent
Volant et al.

(10) Patent No.: US 8,455,356 B2
(45) Date of Patent: Jun. 4, 2013

(54) INTEGRATED VOID FILL FOR THROUGH SILICON VIA

(75) Inventors: Richard P. Volant, New Fairfield, CT (US); Mukta G. Farooq, Hopewell Junction, NY (US); Kevin S. Petrarca, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 393 days.

(21) Appl. No.: 12/690,948

(22) Filed: Jan. 21, 2010

(65) Prior Publication Data

US 2011/0175216 A1 Jul. 21, 2011

(51) Int. Cl.
*H01L 25/11* (2006.01)

(52) U.S. Cl.
USPC ............................. 438/667; 438/700; 257/686

(58) Field of Classification Search
USPC .................................................. 438/700, 667
See application file for complete search history.

(56) References Cited

U.S. PATENT DOCUMENTS

| | | |
|---|---|---|
| 7,541,203 B1 | 6/2009 | Knickerbocker |
| 2006/0040471 A1 | 2/2006 | Ramanathan et al. |
| 2008/0142990 A1 | 6/2008 | Yu et al. |
| 2009/0032951 A1 | 2/2009 | Andry et al. |
| 2009/0194864 A1 | 8/2009 | Dang et al. |
| 2009/0278251 A1 | 11/2009 | Tsai et al. |

FOREIGN PATENT DOCUMENTS

| | | |
|---|---|---|
| KR | 1020090054123 A | 5/2009 |
| WO | WO2009017835 A2 | 2/2009 |

OTHER PUBLICATIONS

Application No. PCT/US2011/021446, Filed: Jan. 17, 2011, Applicant: International Business Machines Corporation, PCT Search Report and Written Opinion Dated Sep. 9, 2011.
Application No. 112011100120.7, Filing Date: Jan. 17, 2011, Information Materials for IDS, Date of SIPO Office Action: Feb. 27, 2013.

*Primary Examiner* — Matthew W Such
*Assistant Examiner* — Krista Soderholm
(74) *Attorney, Agent, or Firm* — Catherine Ivers; Joseph Petrokaitis

(57) ABSTRACT

A microelectronic assembly and related method of forming a through hole extending through a first wafer and a second wafer are provided. The first and second wafer have confronting faces and metallic features at the faces which are joined together to assemble the first and second wafers. A hole can be etched downwardly through the first wafer until a gap is partially exposed between the confronting faces of the first and second wafers. The hole can have a first wall extending in a vertical direction, and a second wall sloping inwardly from the first wall to an inner opening through which the interfacial gap is exposed. Material of the first or second wafers exposed within the hole can then be sputtered such that at least some of the sputtered material deposits onto at least one of the exposed confronting faces of the first and second wafers and provides a wall between the confronting faces. The method can include resuming etching the hole so as to extend the first wall fully through the first wafer, the wall between the wafers and into the second wafer, such that the wall of the hole extends continuously from the first wafer into the second wafer. An electrically conductive through silicon via can then be formed extending through the first wafer, the wall between the wafers and into the second wafer.

15 Claims, 4 Drawing Sheets

INTEGRATED VOID FILL FOR THROUGH SILICON VIA

BACKGROUND OF THE INVENTION

1. Field of the Invention

This invention relates generally to semiconductor structures and more particularly to a method and structure having an integrated void fill for through silicon via (hereinafter TSV).

2. Description of the Related Art

The designers of electronic equipment are driven to increase the capacity and, generally, the performance that can be extracted per unit volume. This drive has encouraged the adoption of technologies such as stacked packaging in which two or more chips (ICs) are stacked one on top of another in each package, i.e., vertically stacked, with the face of one chip overlying the face of another chip.

One way of fabricating stacked packages is by wafer-level processing, in which two or more wafers are stacked in this manner, with each wafer having metal joining pads on at least one face of the wafer and the joining pads of one wafer confronting the joining pads of the adjacent stacked wafer. Through silicon vias (TSVs) provide one form of electrical interconnection in stacked packages. TSVs can be formed to extend through the stacked wafers at locations spaced from the joining pads to provide wafer-to-wafer electrical interconnections between semiconductor devices of each wafer. The stacked wafers then are joined with packaging elements, e.g., a carrier or package substrate and then are severed into individual packages each containing a plurality of vertically stacked chips.

Once concern of such process of forming stacked packages is that gaps can remain as open paths between the metal joining pads and the TSVs in the interfacial regions between the faces of adjacent chips in each stacked package. The gaps can increase the possibility of electromigration and various other effects that may impact long-term reliability and failure rates of the stacked package.

It would be desirable to provide a method and structure which addresses the above-discussed concerns about the gaps.

SUMMARY OF THE INVENTION

In accordance with an aspect of the invention, a method is provided for forming a through hole extending through a first wafer and a second wafer bonded to the first wafer. The first wafer can have a face and metallic features exposed at the face. The second wafer can have a face confronting the face of the first wafer. Metallic features exposed at the face of the second wafer can be joined with the metallic features of the first wafer. The method can include etching a hole extending through the first wafer until the face of the second wafer is partially exposed. The hole can have a first wall extending in a vertical direction, and the hole can have a second wall sloping inwardly away from the first wall to an inner opening through which the face of the second wafer is exposed. Particles can be directed into the hole to sputter material of at least one of the first and second wafers. The sputtered material can be deposited onto at least one of the exposed confronting faces of the first and second wafers adjacent to the hole. Etching can then be resumed so as to extend the first wall fully through the first wafer, the interfacial gap and into the second wafer. The wall of the hole may extend continuously from the first wafer through the sputtered material and into the second wafer.

In accordance with another aspect of the invention, a method is provided of forming an electrically conductive via extending through a first wafer and a second wafer bonded to the first wafer. The first wafer can have a face and metallic features exposed at the face. The second wafer can have a face confronting the face of the first wafer. Metallic features exposed at the face of the second wafer can be joined with the metallic features of the first wafer. The method can include etching a hole extending through the first wafer until the face of the second wafer is partially exposed. The hole can have a first wall extending in a vertical direction, and the hole can have a second wall sloping inwardly away from the first wall to an inner opening through which the face of the second wafer is exposed. Particles can be directed into the hole to sputter material of at least one of the first and second wafers. The sputtered material can be deposited onto at least one of the exposed confronting faces of the first and second wafers adjacent to the hole. Etching can then be resumed so as to extend the first wall fully through the first wafer, the interfacial gap and into the second wafer. The wall of the hole may extend continuously from the first wafer through the sputtered material and into the second wafer. Conductive material can be deposited within the hole to form an electrically conductive via.

In accordance with another aspect of the invention, a stacked semiconductor chip assembly is provided which can include a first semiconductor chip having a first face with a dielectric material exposed at the first face. Metallic features can be exposed at the first face and protruding away from the dielectric material. The semiconductor chip assembly can include a second semiconductor chip having a second face and a dielectric material exposed at the second face. Metallic features can be exposed at the second face and protruding away from the dielectric material. The second face can confront the first face. The metallic features of the second semiconductor chip can be joined with the metallic features of the first semiconductor chip. The first and second semiconductor chips can include a conductive via extending within the first and second semiconductor chips. The conductive via can be spaced apart from the joined metallic features and can extend through a space between the dielectric material exposed at each of the first and second faces. A wall may at least partially occupy a space adjacent the conductive via. The wall can extend between the dielectric materials exposed at each of the first and second faces. The wall can hinder movement of conductive material between the metallic features and the conductive via.

In accordance with an aspect of the invention, a stacked semiconductor wafer assembly is provided which can include a first semiconductor wafer having a first face and a dielectric material exposed at the first face. Metallic features can be exposed at the first face and protruding away from the dielectric material. The semiconductor wafer assembly can include a second semiconductor wafer having a second face and a dielectric material exposed at the second face. Metallic features can be exposed at the second face and protruding away from the dielectric material. The second face can confront the first face. The metallic features of the second wafer can be joined with the metallic features of the first wafer. The first and second wafers can include a conductive via extending within the first and second wafer. The conductive via can be spaced apart from the joined metallic features and can extend through a space between the dielectric material exposed at each of the first and second faces. A wall may at least partially occupy the space adjacent the conductive via. The wall can extend between the dielectric materials exposed at each of the first and second faces. The wall can hinder movement of conductive material between the metallic features and the conductive via.

BRIEF DESCRIPTION OF THE DRAWINGS

The subject matter which is regarded as the invention is particularly pointed out and distinctly claimed in the claims at the conclusion of the specification. The following detailed description is provided in conjunction with the accompanying drawings in which:

DETAILED DESCRIPTION

Figure 1:
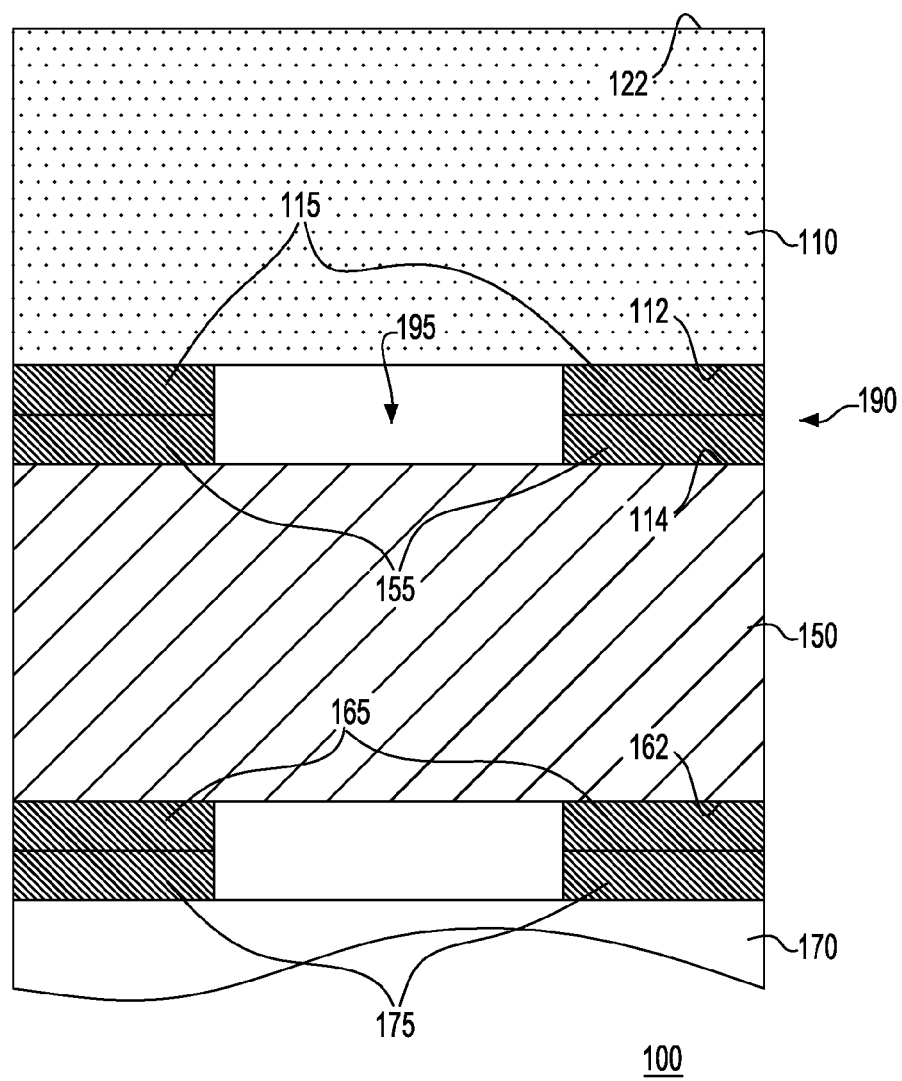
FIG. 1 is a sectional view of a semiconductor assembly 100 having a multi chip or multi wafer structure in a stage of fabrication of a semiconductor assembly in accordance with an embodiment of the invention.

As used in this disclosure, a statement that an electrically conductive structure is "exposed at" a surface of a dielectric structure indicates that the electrically conductive structure is available for contact with a theoretical point moving in a direction perpendicular to the surface of the dielectric structure toward the surface of the dielectric structure from outside the dielectric structure. Thus, a surface of a metal line or other conductive structure which is exposed at a surface of a dielectric structure may project from such surface; may be flush with such surface; or may be recessed relative to such surface and exposed through a hole or depression in the dielectric.

Also, as used herein, "vertical", "up", "down", "above" and "below" and other similar words convey relative position relative to other features described in the drawings. For example, a statement that a surface of a first structure is "above" a surface of a second structure indicates that at least a point on the surface of the first structure is located at a position orthogonally away from the surface of the second structure, whether or not the relative positions of the surfaces conform to a gravitational frame of reference.

FIG. 1 is an illustration of a stacked assembly 100 having a multi chip or multi wafer structure. In the embodiment shown, a side view depiction is provided where a first wafer 110 and a second wafer 150 are stacked on top of one another as shown. Wafers 110 and 150 are bonded to one another.

For example, as shown in FIG. 1, a stacked assembly 100 includes a first wafer 110 having a face 112, i.e., a major surface, and metallic features 115 exposed at this surface. The second wafer 150 has a face 114, i.e., a major surface, confronting the face 112 of the first wafer and metallic features 155 exposed at the face 114. On each wafer, the metallic features may project above and away from dielectric material exposed at the faces 112, 114 of the wafers. The metallic features 155 of the second wafer can be joined with the metallic features 115 of the first wafer 110. In the resulting assembly, the joined metallic features 190 can at least mechanically join the two wafers 110 and 150 and maintain a desired alignment between the features on each wafer. In one example, the joined metallic features 190 can include copper pads which are joined under heat and pressure by direct copper-to-copper bonding, or alternatively, through various other processes in which metal pads, for example, pads consisting essentially of copper, are joined, and wherein the process may or may not include the use of a dissimilar joining metal at an interface where the pads. The same type of metallic features 165, 175, can be used to join the wafer 150 with a third wafer 170. If desired, a fourth wafer or additional wafers (not shown) can be joined in the stacked assembly 100 using additional metal joining pads (not shown) exposed at faces (e.g., face 122, or a remote face of wafer 170 (not shown)). One result of the process shown in FIG. 1 is that a gap 195 can exist in the interfacial region between the adjacent confronting faces 112, 114 of the wafers 110, 150.

The above-discussed concerns can be addressed in accordance with an embodiment of the invention. In a method according to an embodiment herein, a hole can be etched extending downwardly through the first wafer 110 until the gap is partially exposed between the confronting surfaces of the first and second wafers 110 and 150. This hole will have a first wall extending in a vertical direction and a second wall sloping inwardly from the first wall to an inner opening through which the interfacial gap is exposed. A sputtering process then can be performed to dislodge material of the first wafer exposed within the hole between the first wall and the inner opening, i.e., by directing particles of sufficient mass and velocity into the hole. At least some of the sputtered material can deposit onto at least one of the exposed confronting surfaces 112, 114 of the first and second wafers. In this way, the sputtered material can at least partially fill the gap and can form a barrier between the joined metal features 190 and the hole. The etching then can be resumed so as to extend the first wall fully through the first wafer, through a portion of the filled gap and into or through the second wafer, such that the wall of the hole extends continuously from the first wafer through the filled gap and into the second wafer.

Figure 2:
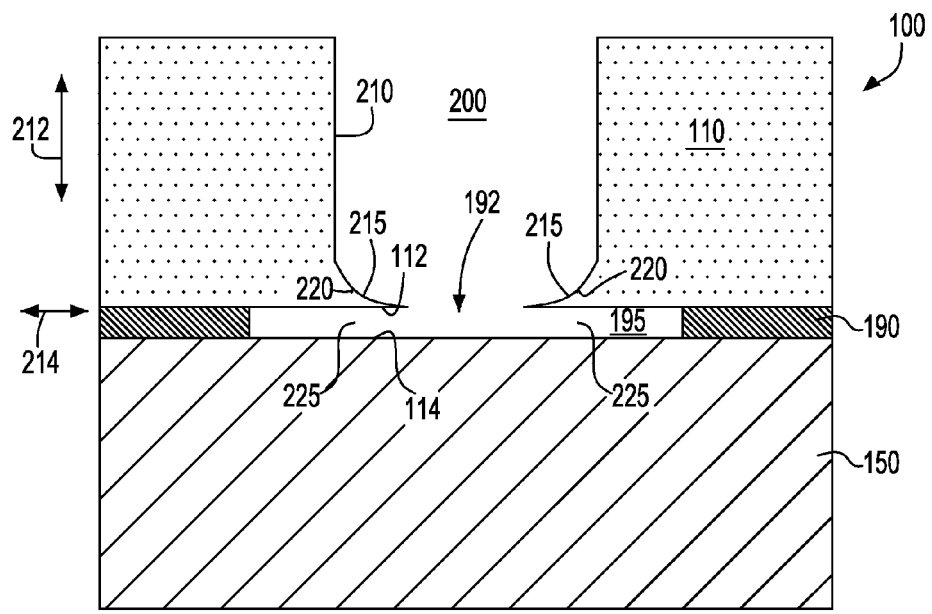
FIG. 2 is a sectional view illustrating a stage in fabrication of a semiconductor assembly subsequent to FIG. 1.

Such method will now be discussed in further detail in conjunction with the figures herein. FIG. 2 is a sectional view illustrating a multi wafer assembly 100 such as was discussed in conjunction with FIG. 1. For ease of description, a third wafer and possible additional wafer of the stacked assembly has been omitted from the view. A first semiconductor wafer 110 is bonded to the second semiconductor wafer 150 and the joined metal features 190 are shown in FIG. 2. As shown an interfacial gap (hereinafter simply referenced as a gap) 195 is disposed between the faces 112, 114 of the wafers.

FIG. 2 shows a step in formation of a TSV that extends in a vertical direction of the assembly 100. In this first step, a hole 200 can be formed such that it extends in a direction through the first wafer 110 until the face 114 of the second wafer is partially exposed between the confronting surfaces 112, 114 of the first and second wafers 110, 150. In one embodiment, the hole 200 has a first wall 210 extending in a vertical direction 212 and a second wall 215 sloping inwardly from the first wall to an inner opening 192 through which the face 114 of the second wafer 150 and the interfacial gap 195 are partially exposed.

A variety of methods can be used to form the hole, such as, for example, a reactive ion etch, laser ablation or drilling or mechanical drilling, and the like. In a particular embodiment, a reactive ion etch (RIE) is used. Etching can be performed such that a hole 200 is formed which extends through the first wafer 110 until the face 114 of the second wafer 150 is partially exposed, and the gap 195 between the faces 112, 114 of the first and second wafers is exposed. The sloping second wall 215 of the hole defines overhangs 220 where the material of the first wafer 110 within the hole 200 overlies the face 114 of the second wafer 150. The portion of the gap 195 underlying the overhangs 220 defines a cavity 225.

Figure 3:
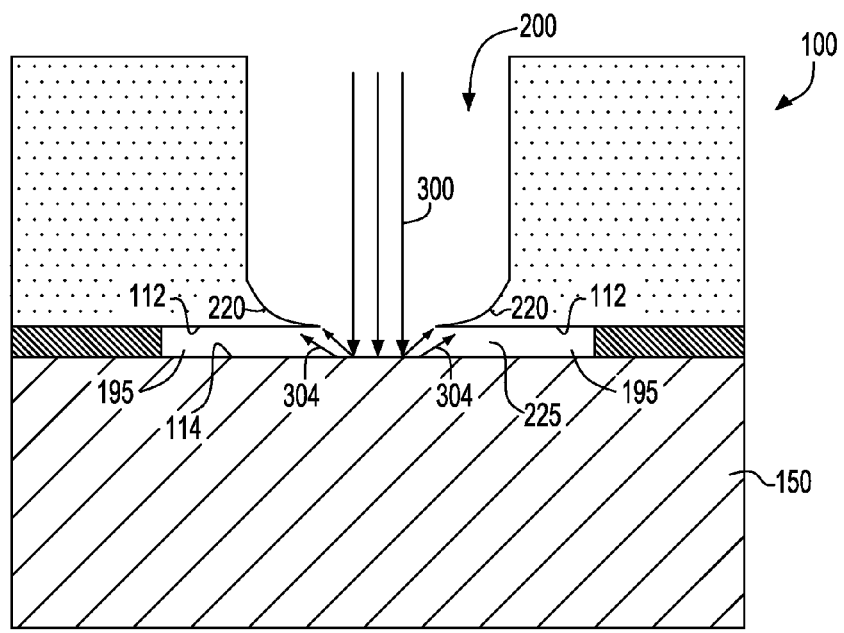
FIG. 3 is a sectional view illustrating a stage in fabrication of a semiconductor assembly subsequent to FIG. 2.

FIG. 3 illustrates a subsequent stage of processing in which a sputtering process is used to direct particles into the hole 200 to dislodge material from at least one of the first or second wafers, such material then being deposited in the cavity 225 or gap 195 between the wafers. In one embodiment, when RIE is used to etch the hole 200, the parameters of the process can be altered to switch from RIE to a silicon sputter process for depositing material into the gap 195.

Figure 4:
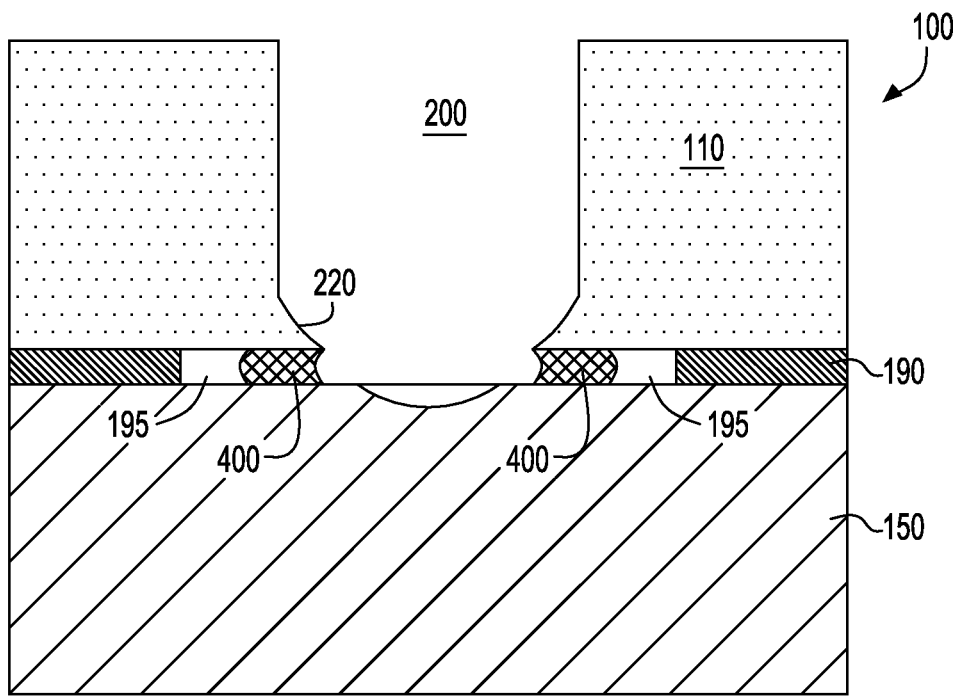
FIG. 4 is a sectional view illustrating a stage in fabrication of a semiconductor assembly subsequent to FIG. 3.

As shown in FIG. 3, the arrows 300 indicate the direction of the sputtering. Particles are directed through hole 200 onto the face 114 of the second wafer 150. Sputtered material, e.g., dielectric material or silicon or both, then can be dislodged from the surface 114 of the second wafer 150 in the direction of the arrows 304. The sputtered material can be deposited into the cavity 225 and the gap 195 as shown. As shown in FIG. 4, the sputtered material 400 can now occupy a space in the cavity 225 adjacent to the hole, such that the sputtered material can entirely surround the hole 200.

Figure 5A:
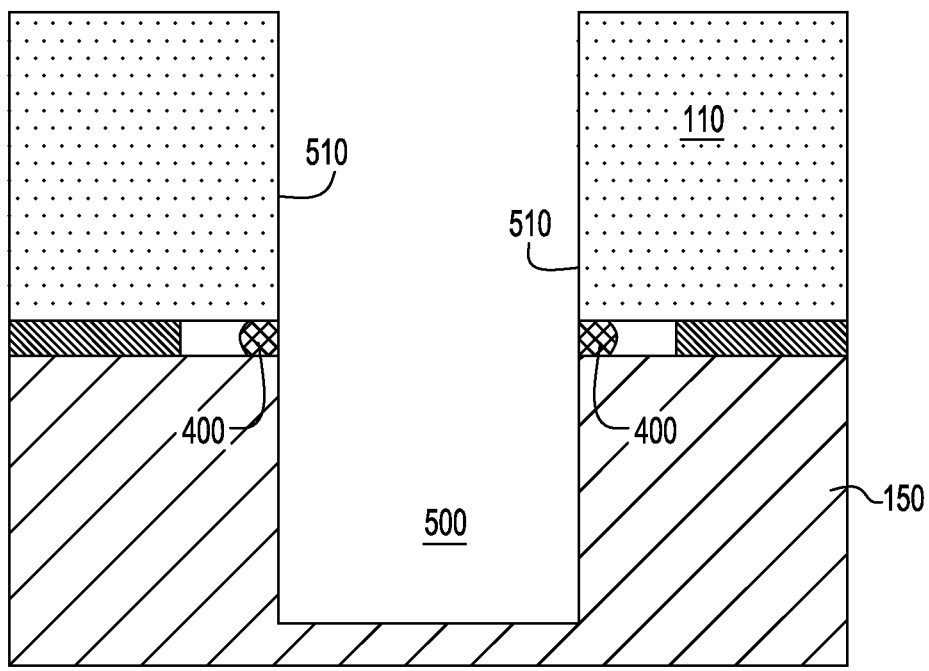
FIG. 5A is a sectional view illustrating a stage in fabrication of a semiconductor assembly subsequent to FIG. 4.

Subsequently, the process parameters can be switched from sputtering back to RIE so as to continue etching to form a hole 500 which extends into or through the second wafer 150. RIE can be used to continue etching the hole downwardly into the second wafer 150. Such process includes removal of the overhangs 220 (FIG. 4) within the hole, so as to form a hole 500 which can have a continuous or nearly continuous wall 510, as shown in FIG. 5A. After forming the hole 500, an insulating coating can be formed along the wall thereof 510, after which a conductive structure, e.g., a metal lining or filling can be provided to form the TSV.

Figure 5B:
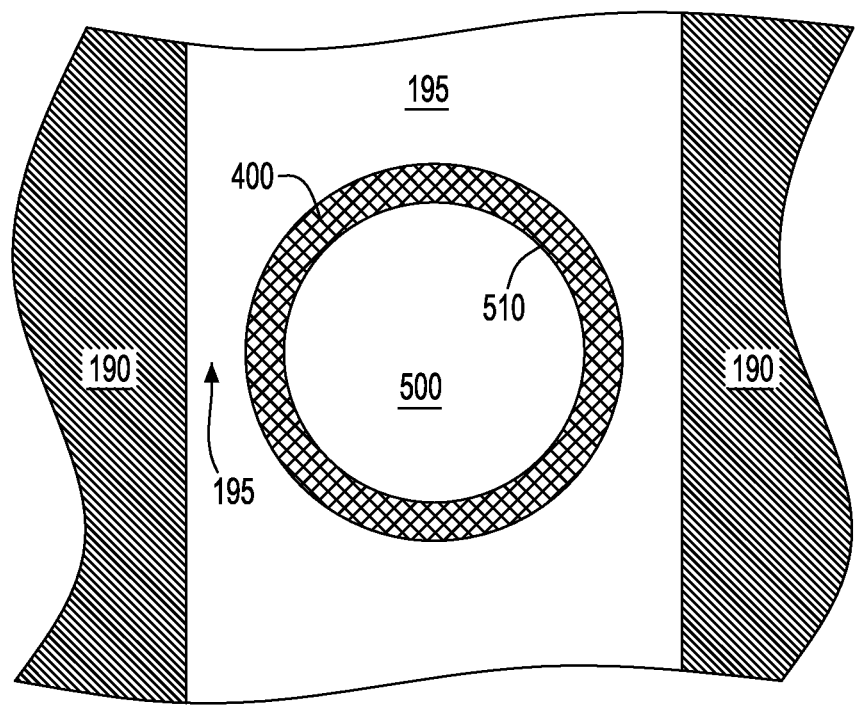
FIG. 5B is a fragmentary plan view corresponding to the sectional view shown in FIG. 5A.

As seen in the plan view provided in FIG. 5B, the sputtered material 400 may form a barrier which completely surrounds a wall 510 of the hole. The sputtered material 400 may provide an effective barrier against electromigration or other possible movement or transport of conductive material between the joined metal features 190 of the stacked assembly and conductive material within the hole 500. Accordingly, once a conductive structure, e.g., metal lining or filling is provided within the hole 500 to form the TSV, the sputtered material 400 can help avoid the movement of conductive material in directions either away from or toward the joined metal features 190.

Figure 6:
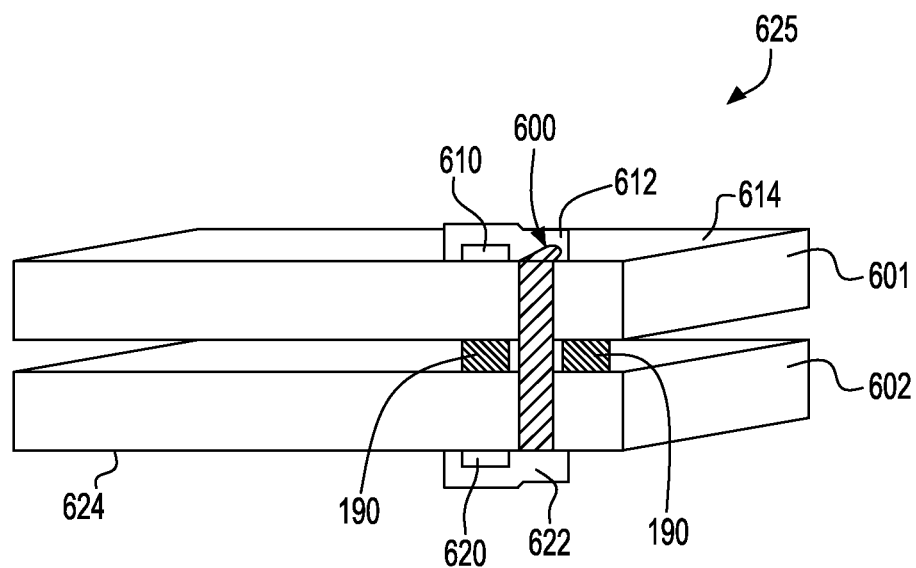
FIG. 6 is a cutaway perspective view illustrating a stacked unit assembly containing a plurality of chips, in accordance with an embodiment of the invention.

FIG. 6 illustrates a stage in processing in which TSVs have been electrically connected with conductive contacts of the chip of the wafers and the stacked assembly can be severed into individual stacked units 625. As seen in FIG. 6, unit 625 can contain stacked chips 601, 602 which can be assembled together by joined metal features 190. The stacked unit can contain a plurality of TSVs such as TSV 600. Electrical interconnection of the chips can be provided, for example, through TSV 600 and metal patterns 612, 622, which electrically connect the TSV with contacts 610, 620, provided at faces 614, 624 of the chips, respectively.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of forming a through hole extending through a first wafer and a second wafer bonded to the first wafer, the first wafer having a face and metallic features exposed at the face, the second wafer having a face confronting the face of the first wafer and metallic features exposed thereat and joined with the metallic features of the first wafer, the method comprising:

a) etching a hole extending through the first wafer until the face of the second wafer is partially exposed, the hole having a first wall extending in a vertical direction, the hole having a second wall sloping inwardly away from the first wall to an inner opening through which the face of the second wafer is exposed;

b) directing particles into the hole to sputter material of at least one of the first and second wafers, the sputtered material being deposited onto at least one of the exposed confronting faces of the first and second wafers adjacent to the hole; and c) resuming etching the hole so as to extend the first wall fully through the first wafer, the interfacial gap and into the second wafer, such that the wall of the hole extends continuously from the first wafer through the sputtered material and into the second wafer.

2. A method as claimed in claim 1, wherein the first wall defines a first diameter of the hole and the inner opening defines a second diameter of the hole which is smaller than the first diameter.

3. A method as claimed in claim 2, wherein once said hole is partially in step a), said second wall at least partially overhanging said gap.

4. A method as claimed in claim 1, wherein said overhang areas are used to direct sputter material into said gap.

5. A method as claimed in claim 1, wherein step b) includes sputtering semiconductor material exposed at the second wall, wherein the sputtered semiconductor material deposits within the gap between the confronting faces of the first and second wafers.

6. A method as claimed in claim 1, wherein steps a) and c) are performed such that the wall extends in a continuous vertical direction transverse to a plane defined by the exposed face of the first wafer.

7. A method as claimed in claim 1, wherein said steps a) and c) including reactive ion etching (RIE).

8. A method as claimed in claim 1, wherein step b) includes forming a wall of the sputtered material, the wall completely surrounding an interior volume of the hole.

9. A method as claimed in claim 1, wherein step b) includes altering parameters of the RIE to switch to silicon sputtering.

10. A method of forming an electrically conductive via extending through a first wafer and a second wafer bonded to the first wafer, the first wafer having a face and metallic features exposed at the face, the second wafer having a face confronting the face of the first wafer and metallic features exposed thereat and joined with the metallic features of the first wafer, the method comprising:

a) etching a hole extending through the first wafer until the face of the second wafer is partially exposed, the hole having a first wall extending in a vertical direction, the hole having a second wall sloping inwardly away from the first wall to an inner opening through which the face of the second wafer is exposed;

b) directing particles into the hole to sputter material of at least one of the first and second wafers, the sputtered material being deposited onto at least one of the exposed confronting faces of the first and second wafers adjacent to the hole;

c) resuming etching the hole so as to extend the first wall fully through the first wafer, the interfacial gap and into the second wafer, such that the wall of the hole extends continuously from the first wafer through the sputtered material and into the second wafer; and d) depositing conductive material within the hole to form an electrically conductive via.

11. A method as claimed in claim 10, wherein each of the first and second wafers includes a plurality of chips attached together at dicing lanes of each wafer, wherein the method further comprises: after forming the via e) severing the bonded wafers along the dicing lanes into individual stacked units, each unit containing a first chip of the first wafer and a second chip of the second wafer and a via extending through the first and second chips.

12. A method as claimed in claim 10, further comprising forming an insulating layer over a wall of the hole prior to depositing the conductive material.

13. A method as claimed in claim 12, wherein the step of forming the insulating layer includes depositing an insulating material.

14. A method as claimed in claim 10, wherein three or more wafers are bonded together and steps a) through c) form the hole to extend within each of the bonded wafers.

15. A method as claimed in claim 10, wherein said step b) includes silicon sputtering.

* * * * *